United States Patent
Lum et al.

(10) Patent No.: US 8,619,478 B2
(45) Date of Patent: Dec. 31, 2013

(54) SYSTEM AND METHOD FOR GENERATING A CLOCK

(75) Inventors: Annie-Li-Keow Lum, San Jose, CA (US); Derek C. Tao, Fremont, CA (US); Bing Wang, Palo Alto, CA (US)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 162 days.

(21) Appl. No.: 13/253,822

(22) Filed: Oct. 5, 2011

(65) Prior Publication Data
US 2013/0088927 A1    Apr. 11, 2013

(51) Int. Cl.
*G11C 7/10*    (2006.01)

(52) U.S. Cl.
USPC ............... 365/189.05; 365/194; 365/233.11; 365/189.011; 365/191; 365/233.1; 365/233.12

(58) Field of Classification Search
USPC ........ 365/189.05, 194, 233.11, 189.011, 191, 365/233.1, 233.12
See application file for complete search history.

(56) References Cited

U.S. PATENT DOCUMENTS 7,061,822 B2 *  6/2006  Jung ..................... 365/230.05

* cited by examiner

*Primary Examiner* — Fernando Hidalgo
(74) *Attorney, Agent, or Firm* — Lowe Hauptman & Ham, LLP

(57) ABSTRACT

A first clock is received by a memory macro. In response to a first clock transition of the first clock, a first transition of a second clock and of a third clock is generated. A tracking transition of a tracking signal is caused by the second clock. Based on a later transition of a second clock transition of the first clock and the tracking transition of the tracking signal, a second transition of the third clock is generated. The third clock is for use by an input-output of the memory macro.

20 Claims, 12 Drawing Sheets

900A

| | EXCLK | TRRSET | ICLK | XCLK | YCLK |
|---|---|---|---|---|---|
| 905 | ^ | 1 | v | ^ | ^ |
| 910 | 1 | 1 | 0 | 1 | 1 |
| 915 | v | 1 | 0 | 1 | 1 |
| 920 | 0 | v | ^ | v | v |

FIG. 9A

| | EXCLK | TRRSET | ICLK | XCLK | YCLK |
|---|---|---|---|---|---|
| 1005 | ^ | 1 | v | ^ | ^ |
| 1010 | 1 | 1 | 0 | 1 | 1 |
| 1015 | 1 | v | ^ | v | 1 |
| 1020 | v | 0 | 1 | 0 | v |

FIG. 10A

SYSTEM AND METHOD FOR GENERATING A CLOCK

FIELD

The present disclosure is related to a pulse width of a clock.

BACKGROUND

In one approach, a read and a write operation of a memory macro are performed at a same address. To that end, an internal clock of the memory macro is used to turn off the read word line and the read output latch before the write clock is enabled. The internal clock for the read operation in this approach is generated based on a tracking circuit. Because of variations in the manufacturing process, the tracking circuit, however, causes a narrow read margin in some conditions, especially at lower operating voltages.

BRIEF DESCRIPTION OF THE DRAWINGS

The details of one or more embodiments of the disclosure are set forth in the accompanying drawings and the description below. Other features and advantages will be apparent from the description, drawings, and claims.

FIG. 9A is a table and FIG. 9B is a graph of waveforms used to illustrate the relationship between various signals when the tracking reset signal falls after the external clock falls, in accordance with some embodiments.

FIG. 10A is a table and FIG. 10B is a graph of waveforms used to illustrate the relationship between various signals when the tracking reset signal falls before the external clock falls, in accordance with some embodiments.

Like reference symbols in the various drawings indicate like elements.

Detailed Description

Figure 1:
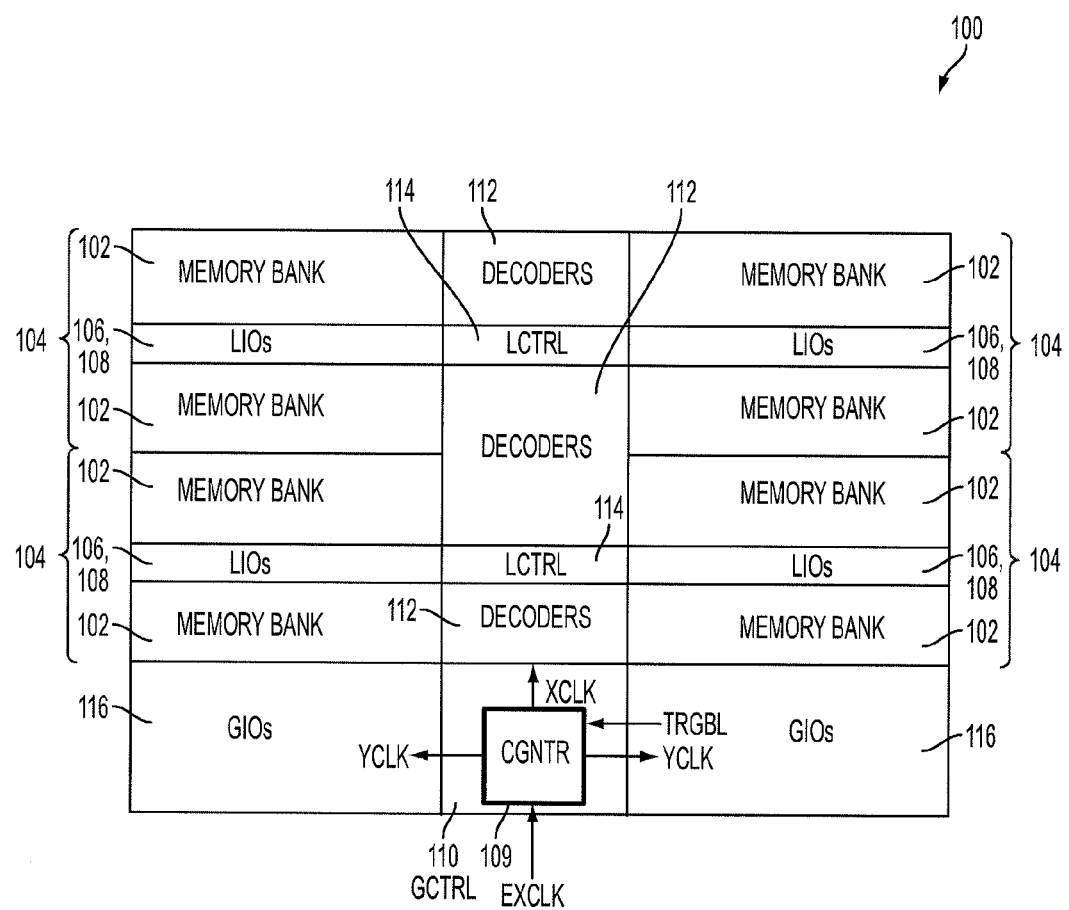
FIG. 1 is a block diagram of a memory macro, in accordance with some embodiments.

Embodiments, or examples, illustrated in the drawings are disclosed below using specific language. It will nevertheless be understood that the embodiments and examples are not intended to be limiting. Any alterations and modifications in the disclosed embodiments, and any further applications of the principles disclosed in this document are contemplated as would normally occur to one of ordinary skill in the pertinent art.

Some embodiments have one or a combination of the following features and/or advantages. A read margin is improved while a read and a write operation is allowed at a same address of a memory macro in the same operating cycle. The width of a clock to control the global input-output is generated based on the latter of the falling edge of an external clock and the falling edge of a tracking reset signal. As a result, the read margin is improved.

Exemplary SRAM Macro

FIG. 1 is a block diagram of a static random access memory (SRAM) macro 100, in accordance with some embodiments. In this document "rise" refers to transitioning from a low logic value to a high logic value. "Fall" refers to transitioning from a high logic value to a low logic value.

Figure 2:
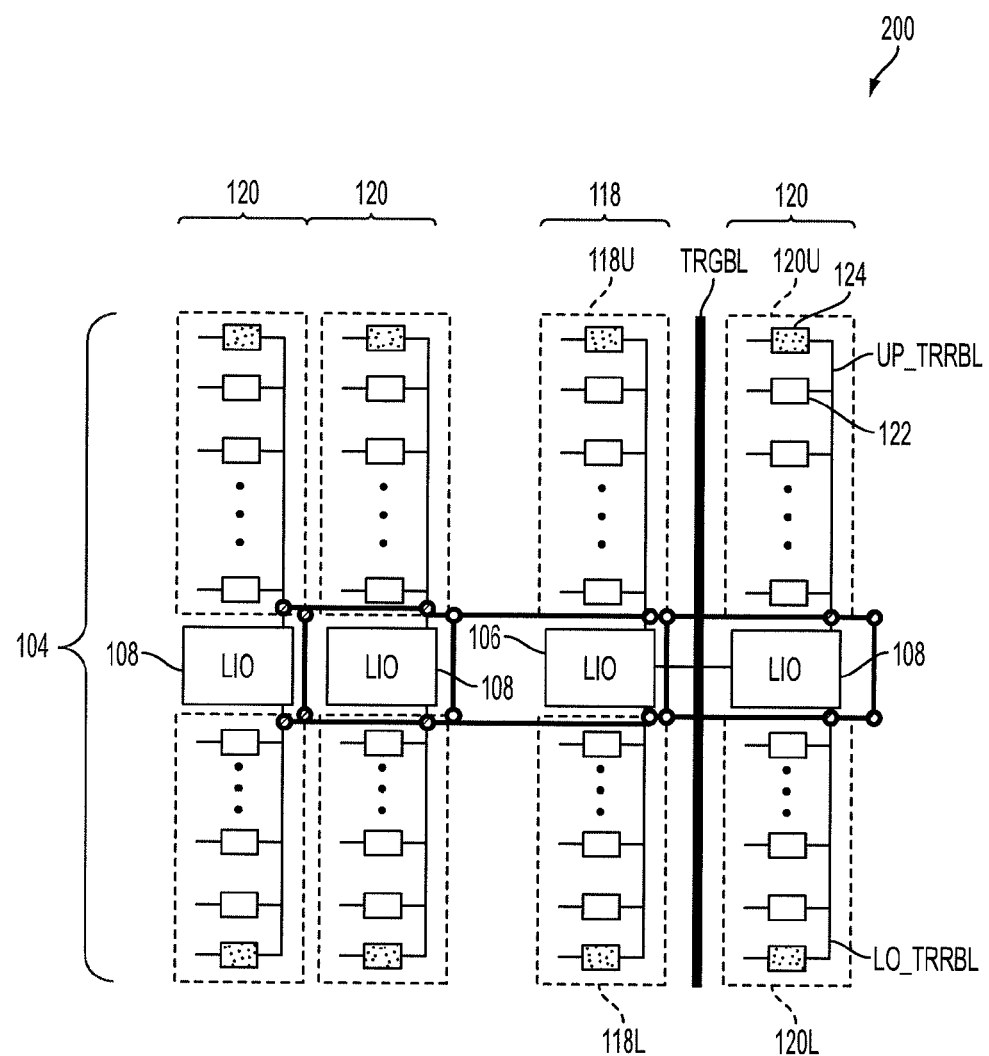
FIG. 2 is a diagram of a tracking circuit, in accordance with some embodiment.

Memory macro 100 includes a plurality of memory segments 104. Four memory segments 104 are shown for illustration, but a different number of memory segments 104 is within the scope of various embodiments. Each segment 104 includes two memory banks 102 sharing a row of a plurality of local input/output circuits (LIO) 106 and 108. Different configurations of a memory segment are within the scope of various embodiments. Each memory bank 102 includes a plurality of memory cells 122 and a plurality of tracking memory cells 124. Both memory cells 122 and tracking memory cells 124 are shown in FIG. 2.

Address decoders 112 provide the X- or row-address of memory cells 122 to be accessed for a read or a write operation.

Local control circuits (LCTRL) 114 controls LIOs 106 and 108, including, for example, turning on and off the read word lines and write word lines of the LIOs.

Global IOs (GIOs) 116 serve to transfer data between the memory cells and other circuits outside of memory macro 100.

Global control circuit (GCTRL) 110 provides the address pre-decode, clock, and other signals for memory macro 100. GCTRL 110 includes a Y-decoder (not shown) that provides the Y- or column address of a memory cell. GCTRL 110 controls reading and writing operations and the data transfer between memory cells 122 to circuits outside of memory macro 100.

Figure 3:
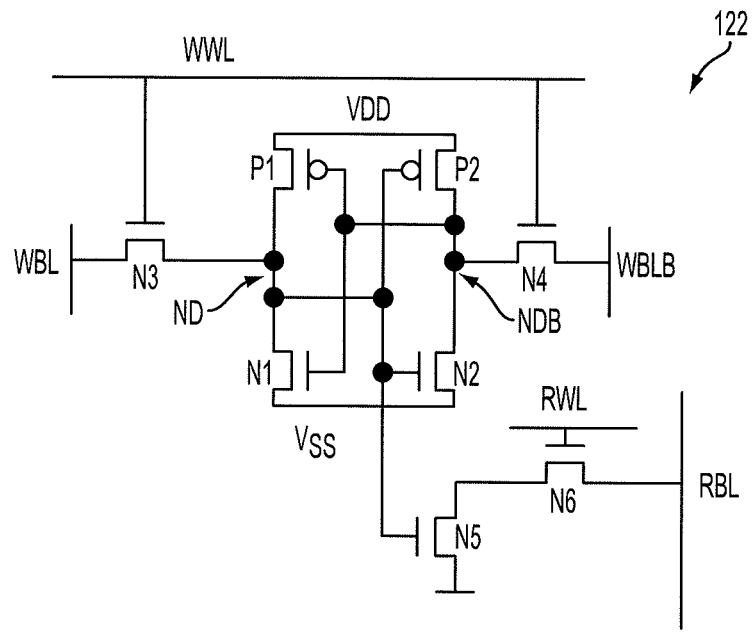
FIG. 3 is a circuit diagram of a memory cell, in accordance with some embodiments.
Figure 4:
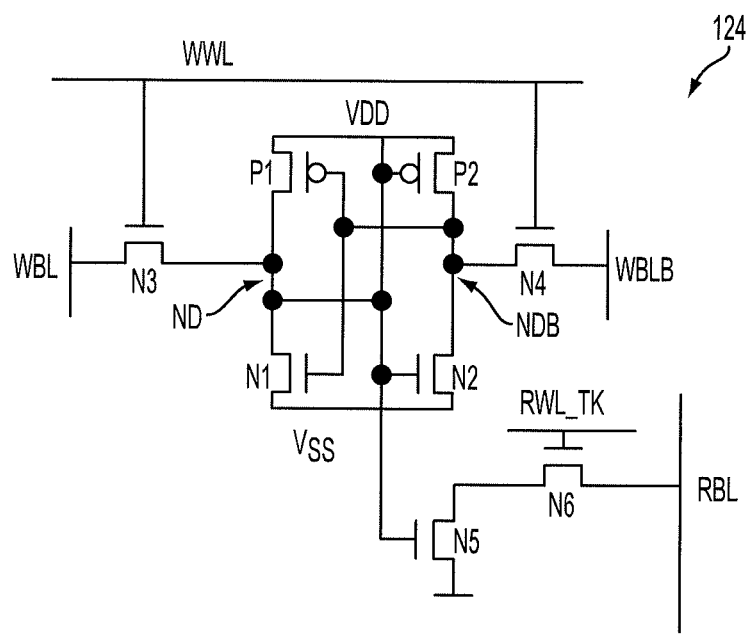
FIG. 4 is a circuit diagram of a tracking memory cell, in accordance with some embodiments.
Figure 8:
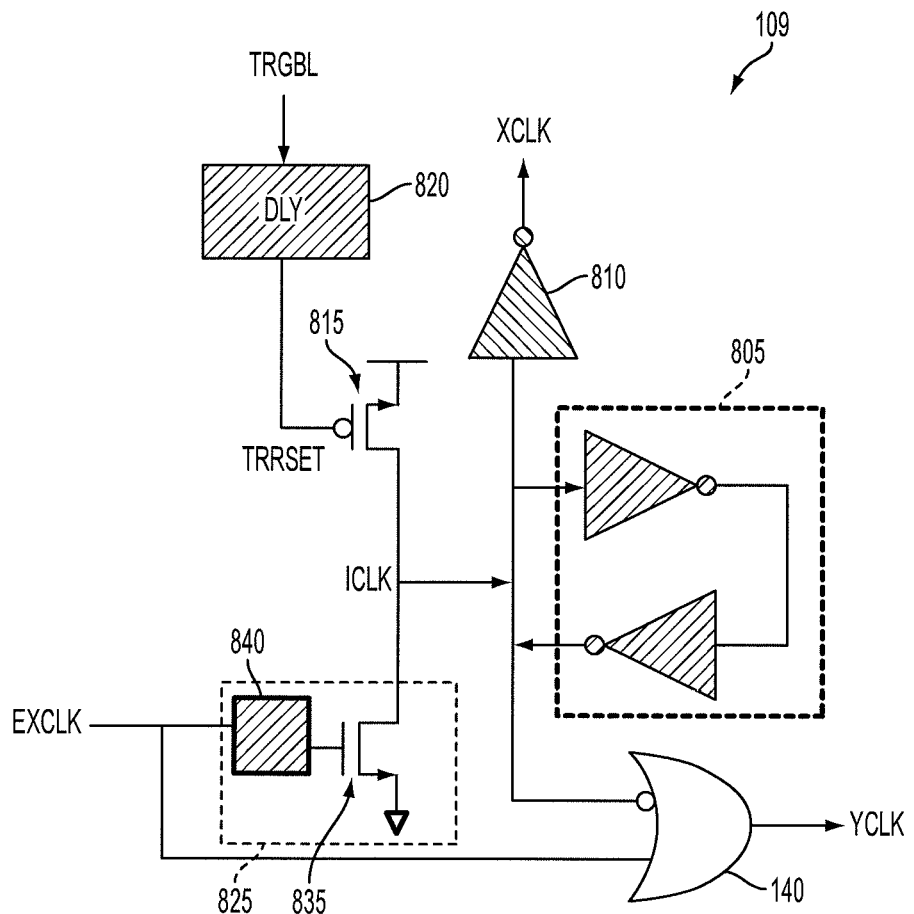
FIG. 8 is a block diagram of the clock generator, in accordance with some embodiments.

Clock generator (CGNTR) 109 receives an external clock EXCLK and tracking global bit line TRGBL as inputs and generates an intermediate clock ICLK (shown in FIG. 8). Based on intermediate clock ICLK, clock generator 109 generates a clock XCLK running in the X decoders 112 direction and two clocks YCLK running in the Y decoders 116 directions. Clocks XCLK and YCLK are commonly called the X-clock and Y-clock, respectively. X-clock XCLK controls the read word line pulse width of memory cells 122 and of tracking memory cells 124. A memory cell 122 and a tracking memory cell 124 are shown in FIGS. 3 and 4, respectively. Y-clock YCLK controls the data in GIOs 116. For example, in some embodiments, the rising edge of Y-clock YCLK turns off the tri-state feedback inverters and turns on the multiplexers in GIOs 116 so that the data in memory cells 122 that have been transferred to the global bit lines of memory macro 100 are transferred to the outputs of memory macro 100. In contrast, the falling edge of Y-clock YCLK turns off the multiplexers and turns on the tri-state feedback inverters. Tracking global bit line TRGBL is generated based on X-clock XCLK. The details of clock generator 109 are explained with reference to FIG. 8.

In some embodiment, a rising edge of external clock EXCLK causes clock YCLK to rise from a low logic value to a high logic value. An intermediate clock ICLK is created based on external clock EXCLK. The high duration of clock YCLK is achieved by a logical OR operation of the high duration of external clock EXCLK and an inverse of intermediate clock ICLK. As a result, the high duration of clock YCLK is the larger of the high duration of external clock EXCLK and the low duration of intermediate clock ICLK. Because the duration of clock YCLK is enlarged, a read margin is increased.

The transition of global tracking bit line TRGBL causes a transition in a reset signal, which is called a reset transition. In some embodiments, the reset is a low logic reset. That is, the reset transition is from a high logic value to a low logic value. A high logic reset is within the scope of various embodiments.

Exemplary Tracking Circuit

FIG. 2 is a diagram of various elements of a segment 104 illustrating a tracking circuit 200, in accordance with some embodiments. For simplicity, one memory cell 122 of various memory cells 122 and one tracking memory cell 124 of eight tracking memory cells 124 are labeled. One upper column 120U of three upper columns 120U and one lower column 120L of three lower columns 120L are labeled. One upper tracking read bit line of four tracking read bit lines UP_TRRBL, and one lower tracking read bit line of four tracking read bit lines LO_TRRBL are labeled.

Tracking circuit 200 includes one column 118 and three columns 120. Each column 120 includes one LIO 108 with a column 120U above the LIO 108 and a column 120L below the LIO 108. Each column 120U includes a plurality of memory cells 122 and one tracking memory cell 124 coupled to an upper tracking read bit line UP_TRRBL. Each column 120L includes a plurality of memory cells 122 and one tracking memory cell 124 coupled to a lower tracking read bit line LO_TRRBL. A column 118 includes one LIO 106 with a column 118U above the LIO 106 and a column 118L below the LIO 106. Column 118U includes a plurality of memory cells 122 and one tracking memory cell 124 coupled to an upper tracking read bit line UP_TRRBL. Column 118L includes a plurality of memory cells 122 and one tracking memory cell 124 coupled to a lower tracking read bit line LO_TRRBL.

In some embodiments, upper tracking read bit lines UP_TRRBL and lower tracking read bit lines LO_TRRBL of all three columns 120 and of column 118 are coupled together. Upper tracking bit lines UP_TRRBL, lower tracking bit lines LO_TRRBL, and a tracking global bit line TRGBL are coupled to tracking LIO 106. Column 118 and one column 120 are on one right side of memory macro 100, and the other two columns 120 are on one left hand side of memory macro 100. In some embodiments, column 118 and columns 120 are selected adjacent to decoders 112 and local control circuitry LCTRL 114 in FIG. 1 to increase the speed and simplify the implementation of memory 100. Different locations of column 118 and/or columns 120 are within the scope of various embodiments. The relative locations of a column 118 and 120 are within the scope of various embodiments. For example, two columns 120 and a combination of a column 118 and a column 120 may be next to one another as shown in FIG. 2, but they may be separated by one or a plurality of columns of regular memory cells 122.

Columns 120 are used to create the load for column 118. Three columns 120 are used for illustrations, a different number of columns 120 used as a load for column 118 is within the scope of various embodiments.

A column 118 and a column 120 each are a variation of a column of regular memory cells 122. For example, in a column of regular memory cells 122, there is no tracking cell 124. That is, the cells coupled to an upper read bit line or a lower read bit line are all regular memory cells 122. The upper read bit lines and the lower read bit lines of a column of regular memory cells 122 are not coupled together.

Exemplary Memory Cell

FIG. 3 is a circuit diagram of a memory cell 122, in accordance with some embodiments. Memory cell 122 includes two P-type Metal Oxide Semiconductor (PMOS) transistors P1 and P2, and six N-type Metal Oxide Semiconductor (NMOS) transistors N1, N2, N3, N4, N5, and N6.

The gates of NMOS transistor N3 and N4 are coupled to a write word line WWL. A write word line WWL is coupled to the gates of transistors N3 and N4 of a plurality of memory cells 122 to a form a row of memory cells.

The gate of transistor N6 is coupled to a read word line RWL. A read word line RWL is coupled to the gates of transistors N6 of the plurality of memory cells 122 that are coupled to a corresponding write word line WWL.

The drain of transistor N6 is coupled to a read bit line RBL. Read bit line RBL is coupled to the drains of a plurality of transistors N6 of a plurality of memory cells 122 to form a column 118U, 118L, 120U, or 120L. If memory cell 122 is in a column 118U or in a column 120U, read bit line RBL is called upper read bit line UP_TRRBL. But if memory cell 122 is in a column 118L or in a column 120L, read bit line RBL is called lower read bit line LO_TRRBL.

The drains of transistors N3 and N4 are coupled to a pair of write bit lines WBL and WBLB, respectively. The pair of write bit lines WBL and WBLB is coupled to the drains of transistors N3 and N4 of the plurality of memory cells 122 that are coupled to the corresponding read bit line RBL.

In a write operation for memory cell 122, write word line WWL is activated. The logic values to be written to memory cell 122 are placed at write bit lines WBL and WBLB, which are then transferred or stored at nodes ND and NDB at the sources of transistor N3 and N4, respectively.

In a read operation, read word line RWL is activated to turn on transistor N6. Detecting the voltage value at read line RBL reveals the data stored in nodes NDB and ND.

Exemplary Tracking Memory Cell

FIG. 4 is circuit diagram of a tracking memory cell 124, in accordance with some embodiments. Tracking memory cell 124 includes components similar to those of memory cell 122. The gate of transistors P2, N2, and N5 in tracking cell 124, however, are configured to receive operational voltage VDD. As a result, PMOS transistor P2 is always off while NMOS transistors N2 and N5 are always on. Similar to memory cell 122, if track memory cell 124 is in a column 118U or a column 120U, read bit line RBL is called upper read bit line UP_TRRBL. But if tracking memory cell 124 is in a column 118L or a column 120L, read bit line RBL is called lower read bit line LO_TRRBL.

Exemplary LIOs

Figure 5:
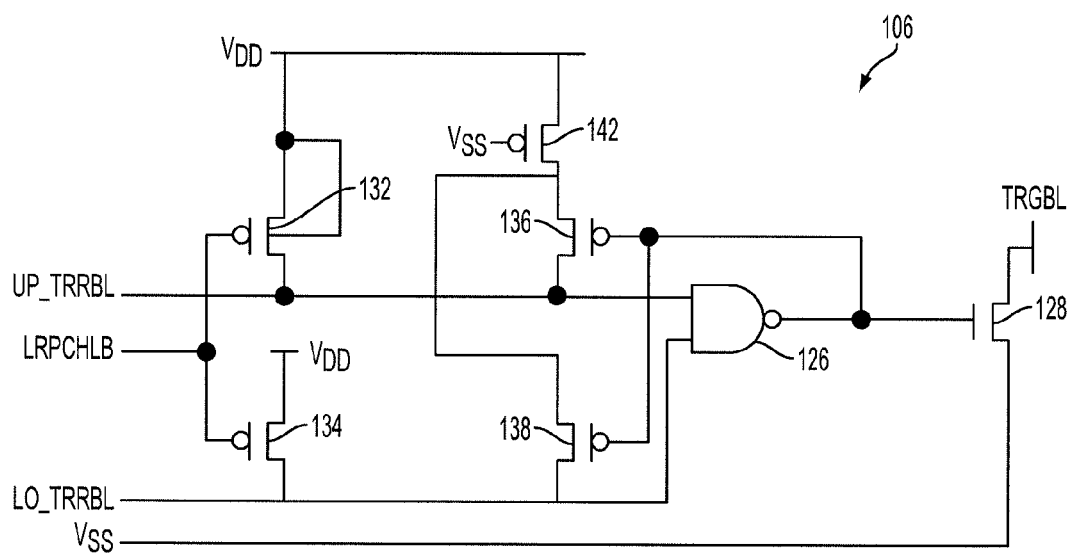
FIG. 5 is a circuit diagram of a local input/output (IO) circuit, in accordance with some embodiments.

FIG. 5 is a circuit diagram of an LIO 106, in accordance with some embodiments. Each input of NAND gate 126 is coupled to a read bit line, which, for illustration, is upper read bit line UP_TRRBL and lower read bit line LO_TRRBL. In some embodiments as illustrated in FIG. 2, upper read bit line UP_TRRBL and lower read bit line LO_TRRBL are coupled together. In a regular column that there is no tracking memory cell 124, upper read bit line is called UP_RBL (not labeled), and lower read bit line is called LO_RBL (not labeled). Upper read bit line UP_RBL and lower read bit line LO_RBL are not coupled together.

The output of NAND gate 126 controls the gate of transistor 128, or, effectively, controls tracking global bit line TRGBL at the drain of transistor 128. Transistors 132, 134, 136, and 138 provide appropriate voltage values to the inputs of NAND gate 126, based on control signal LRPCHLB, operational voltage VDD, and reference voltage VSS.

Figure 6:
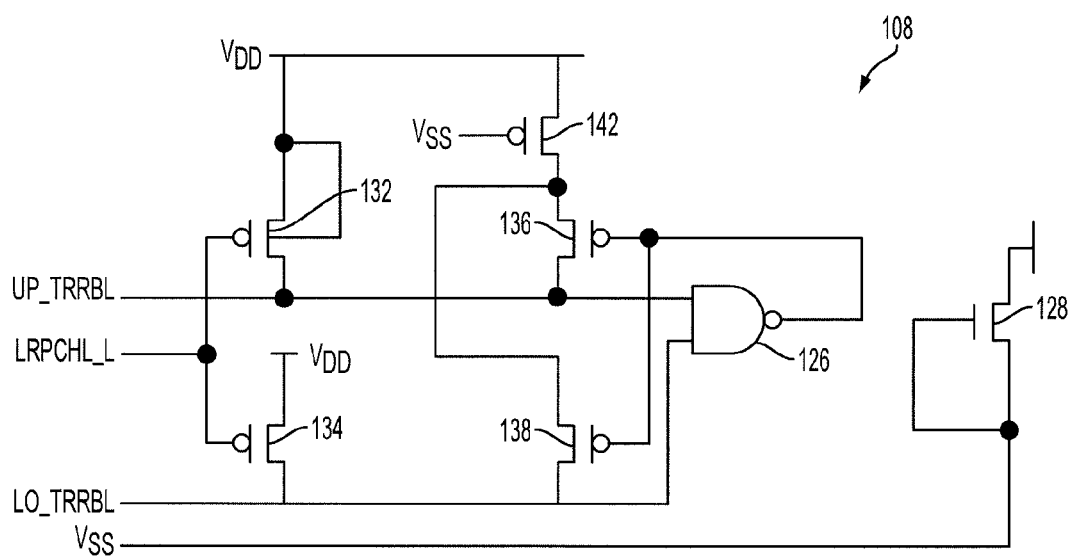
FIG. 6 is a circuit diagram of a tracking IO circuit, in accordance with some embodiments.

FIG. 6 is a circuit diagram of an LIO 108, in accordance with some embodiments. An LIO 108 includes components similar to those of an LIO 106. The output of NAND gate 126 in LIO 108, however, is not coupled to the gate of transistor 128. In contrast, the gate of transistor 128 is coupled to the source of transistor 128 or voltage VSS. As a result, transistor 128 is always off and acts as an open circuit.

Exemplary Transition of Global Tracking Bit Line

Figure 7:
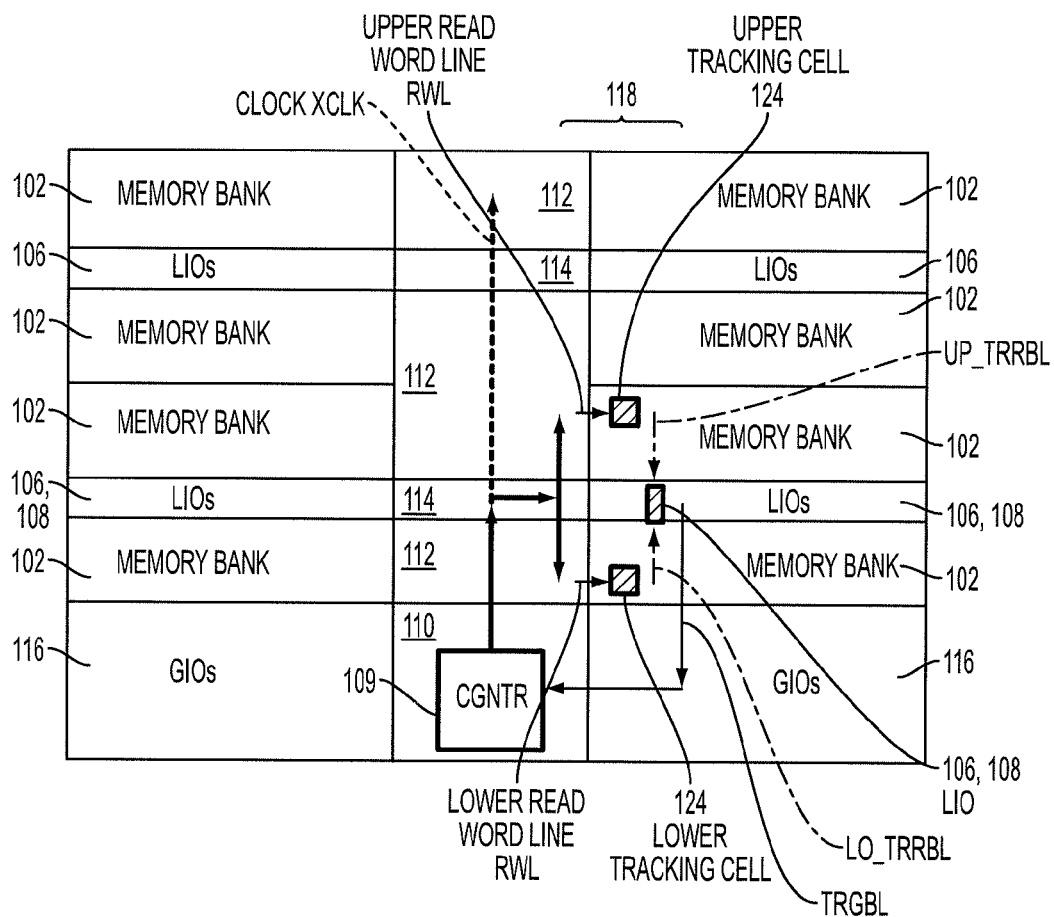
FIG. 7 is a diagram of a macro memory used to illustrate how a reset signal is generated, in accordance with some embodiments.

FIG. 7 is a block diagram of memory macro 100 used to illustrate how tracking global bit line TRGBL is transitioned. In some embodiments, tracking global bit line TRGBL transitions from a high logic value to a low logic value. The transition of tracking global bit line TRGBL is caused by an operation of tracking circuit 200 that includes one column 118 and three columns 120 illustratively shown in FIG. 2. For simplicity, some elements of column 118 in FIG. 2 are shown FIG. 7, but three columns 120 are not shown. Effectively, the transition of tracking global bit line TRGBL is caused by the operations of an upper tracking cell 124 and a lower tracking cell 124 illustratively shown in FIG. 4. As a result, read bit line RBL of the upper tracking cell 124 and of the lower tracking cell 124 correspond to upper read tracking bit line UP_TRRBL of column 118U and lower read tracking bit line LO_TRRBL column 118L, respectively. The transition of tracking global bit line is also caused by the operations of the LIO 106 coupled to upper read tracking bit line UP_TRRBL and lower read tracking bit line LO_TRRBL. The detail of LIO 106 is shown in FIG. 5. In some embodiments, upper read tracking bit line UP_TRRBL, lower read tracking lit line LO_TRRBL, and tracking global bit line TRGBL are initially pre-charged to a high logical value.

Clock XCLK is transmitted from clock generator 109 through various decoders 112 and local control circuitry LCTRL 114. Clock XCLK is also used to activate the upper read word line RWL_TK (shown in FIG. 4) and the lower read word line RWL_TK of the respective upper tracking cell 124 and the lower tracking cell 124. For example, in some embodiments, when clock XCLK has a high logic value during the high duration of clock XCLK, transistors N6 of upper tracking cell 124 and of lower tracking cell 124 are turned on. Upper read tracking bit line UP_TRRBL and lower read tracking bit line LO_TRRBL are pulled to ground or a low logic value at the source of transistors N5 of upper tracking cell 124 and of lower tracking cell 124. NAND gate 126 of LIO 106 illustrated in FIG. 5 receives a low logic value of upper tracking read bit line UP_TRRBL and of lower tracking read bit line LO_TRRBL at both inputs. As a result, output of NAND gate 126 at the gate of transistor 128 has a high logic value, which turns on NMOS transistor 128. Because transistor 128 is turned on, tracking global bit line TRGBL is pulled to reference voltage VSS or a low logic value at the source of transistor 128. Effectively, tracking global bit line TRGBL transitions from a high logic value to a low logic value. In some embodiments, tracking global bit line TRGBL is fed to clock generator 109, and causes a tracking reset signal TRRSET (shown in FIG. 8) to also transition from a high to a low logic value. In this document, the high to low transition of tracking global bit line TRGBL and the high to low transition of tracking reset signal TRRSET are used interchangeably.

In some embodiments, the falling edge of tracking global bit line TRGBL cause clock XLCK to fall. The falling edge of clock XCLK causes a read word line RWL of a memory cell 122 to be read to fall. Effectively, the high pulse width for the corresponding read word line RWL can be determined based on the transition of global tracking bit line TRGBL or the transition of tracking reset signal TRRSET.

In some embodiments, the frequency of clock EXCLK and clock YCLK are the same. In other words, the frequency of clock YCLK follows the frequency of clock EXCLK. The high (and thus the low) pulse widths of clock EXCLK and clock YCLK, however, are different.

Exemplary Clock Generator

FIG. 8 is a diagram of a clock generator 109, in accordance with some embodiments.

Delay circuit 820 (DLY 820) generates tracking reset signal TRRSET based on tracking global bit line TRGBL. For example, in some embodiments, when tracking global bit line TRGBL transitions from a high to a low logic value, circuit DLY 820 also causes tracking reset signal TRRSET to transition from a high to a low logic value. Circuit DLY 820 additionally generates a time delay to control the timing of the transition of tracking global bit line TRGBL to generate tracking reset signal TRRSET. Effectively, circuit DLY 820 controls the time to reset clock XCLK and clock YCLK as explained below.

Circuit 825 and transistor 815 generate intermediate clock ICLK. For example, initially when clock ICLK is logically high, a pulse PULSE (not shown) is created at the gate of NMOS transistor 835 to turn on NMOS transistor 835, which pulls clock ICLK to a low logical value at the source of transistor 835. A falling edge of clock ICLK is therefore formed. When tracking reset signal TRRSET falls, transistor 815 is turned on to pull clock ICLK to a high logic value at the source of transistor 815. As a result, a rising edge of clock ICLK is formed. Pulse width generator 840 generates pulse PULSE to turn on and off transistor 835. For example, when clock EXCLK rises, pulse width generator 840 generates pulse PULSE in which the high logic value of pulse PULSE causes transistor 835 to turn on while the low logic value of pulse PULSE causes transistor 835 to turn off. In some embodiments, pulse PULSE is designed to be a positive pulse and falls before tracking reset signal TRRSET transitions from a high logic value to a low logic value. As a result, NMOS transistor 835 is turned off before PMOS transistor 815 is turned on.

Latch circuit 805 stores the logic state of clock ICLK as would be recognizable by persons of ordinary skill in the art.

Inverter 810 inverts clock ICLK to form clock XLCK. In other words, clock XCLK is the inverse logic of clock ICLK.

NOR gate 140 generates clock YCLK based on clock EXCLK and the inverse of clock ICLK. For illustration, the inverse of clock ICLK is called clock ICLKI (not labeled). In some embodiments, the falling edge of clock YCLK is the later of the falling edge of clock EXCLK and the falling edge of signal ICLKI. The falling edge of clock ICLKI or the rising edge of clock ICLK is caused by the falling edge of signal TRRSET that turns on transistor 815.

Operations of Clock Generator

FIG. 9A is a table illustrating the relationship of various signals, in accordance with some embodiments. In FIG. 9A, tracking reset signal TRRSET falls after external clock EXCLK falls. In the below illustration, a "1" refers to a logical high value, and a "0" refers to a logical low value. A symbol "^" refers to a rising transition while a symbol "v" refers to a falling transition.

For illustration, initially, signal TRRSET, clock ICLK, clock XLCK, and clock YCLK have a high, high, low, and low logic value, respectively. On line 905, clock EXCLK rises. Signal TRRSET remains logically high. The rising edge of clock EXCLK causes clock ICLK to fall, clock XCLK to rise, and clock YCLK to rise.

On line 910, external clock EXCLK and tracking reset signal TRRSET remain logically high. Clocks ICLK, XCLK, and YCLK also remain logically low, high, and high, respectively.

On line 915, external clock EXCLK falls, but does not affect signal TRRSET, clock ICLK, clock XCLK, or clock YCLK. That is, signal TRRSET, clock ICLK, clock XCLK, and clock YCLK remain logically high, low, high, and high, respectively.

On line 920, external clock EXCLK remains logically low. Tracking reset signal TRRSET, however, falls. The falling edge of tracking reset signal TRRSET causes clock ICLK to rise, clock XCLK to rise, and clock YCLK to fall.

Figure 9B:
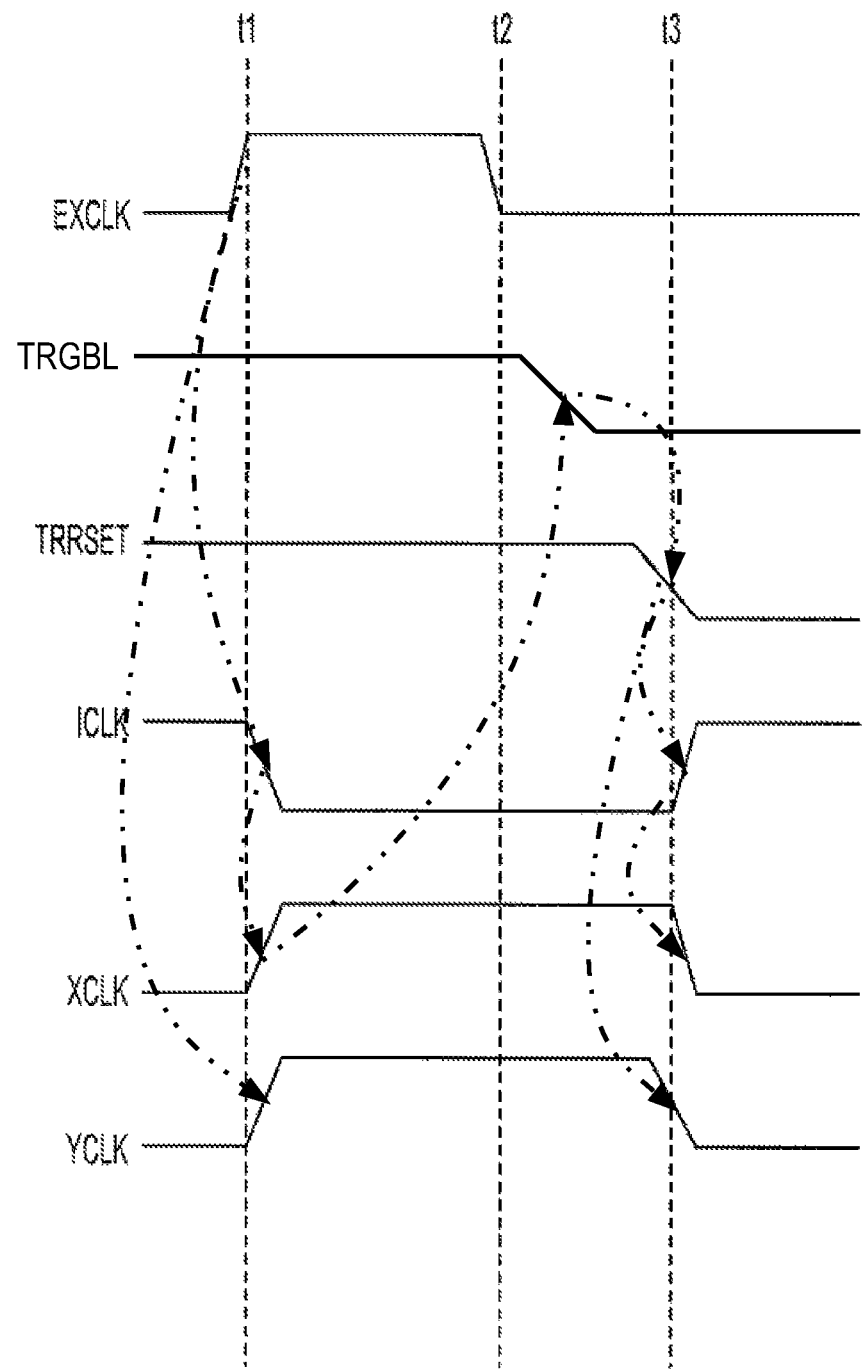

FIG. 9B is a graph of waveforms illustrating the relationship of various signals, in accordance with some embodiments. Times t1, t2, and t3 correspond to line 905, 915, and 920 of FIG. 9A, respectively. Furthermore, delay circuit 820 (DLY 820 in FIG. 8) generates tracking reset signal TRRSET based on tracking global bit line TRGBL. Circuit DLY 820 additionally generates a time delay to control the timing of the transition of tracking global bit line TRGBL to generate tracking reset signal TRRSET.

At time t1, the rising edge of clock EXCLK causes to clock ICLK to fall, clock XCLK to rise, and clock YCLK rise. As a result, clock EXCLK is logically high, signal TRGBL and TRRSET are logically high, clock ICLK is logically low, clock XCLK is logically high, and clock YCLK is logically high.

At time t2, clock EXCLK falls, but does not affect signal TRRSET, clock ICLK, clock XCLK, or clock YCLK. As a result, signal TRRSET, clock ICLK, clock XCLK, and clock YCLK remain logically high, low, high, and high, respectively. Also, prior to time t3, tracking global bit line TRGBL transitions from a high logic value to a low logic value. As illustrated in conjunction with FIGS. 4 and 5, clock XCLK is used to activate the upper read word line RWL TK and the lower read word line RWL TK of the respective upper tracking cell 124 and the lower tracking cell 124. NAND gate 126 of LIO 106 illustrated in FIG. 5 receives a low logic value of upper tracking read bit line UP TRRBL and of lower tracking read bit line LO TRRBL at both inputs.

As a result, prior to time t3, tracking global bit line TRGBL is pulled to reference voltage VSS or a low logic value at the source of transistor 128. At time t3, signal TRRSET falls and causes clock ICLK to rise, clock XCLK to fall, and clock YCLK to fall.

FIG. 10A is a table illustrating the relationship of various signals, in accordance with some embodiments. In FIG. 10A, tracking reset signal TRRSET falls before external clock EXCLK falls.

For illustration, initially, signal TRRSET, clock ICLK, clock XLCK, and clock YCLK have a high, high, low, and low logic value, respectively. On line 1005, clock EXCLK rises. Signal TRRSET remains logically high. The rising edge of clock EXCLK causes clock ICLK to fall, clock XCLK to rise, and clock YCLK to rise.

On line 1010, external clock EXCLK and tracking reset signal TRRSET remain logically high. Clocks ICLK, XCLK, and YCLK also remain logically low, high, and high, respectively.

On line 1015, external clock EXCLK remains logically high, but signal TRRSET falls. That is, signal TRRSET falls before clock EXCLK falls. The falling edge of signal TRRSET causes clock ICLK to rise, clock XCLK to fall, but does not affect clock YLCK. As a result, clock YCLK remains logically high.

On line 1020, signal TRRSET remains logically low. Clock EXCLK, however, falls. The falling edge of clock EXCLK causes clock YCLK to fall, but does not affect clocks ICLK and XCLK. As a result, clocks ICLK and XCLK remain logically high and low, respectively.

Figure 10B:
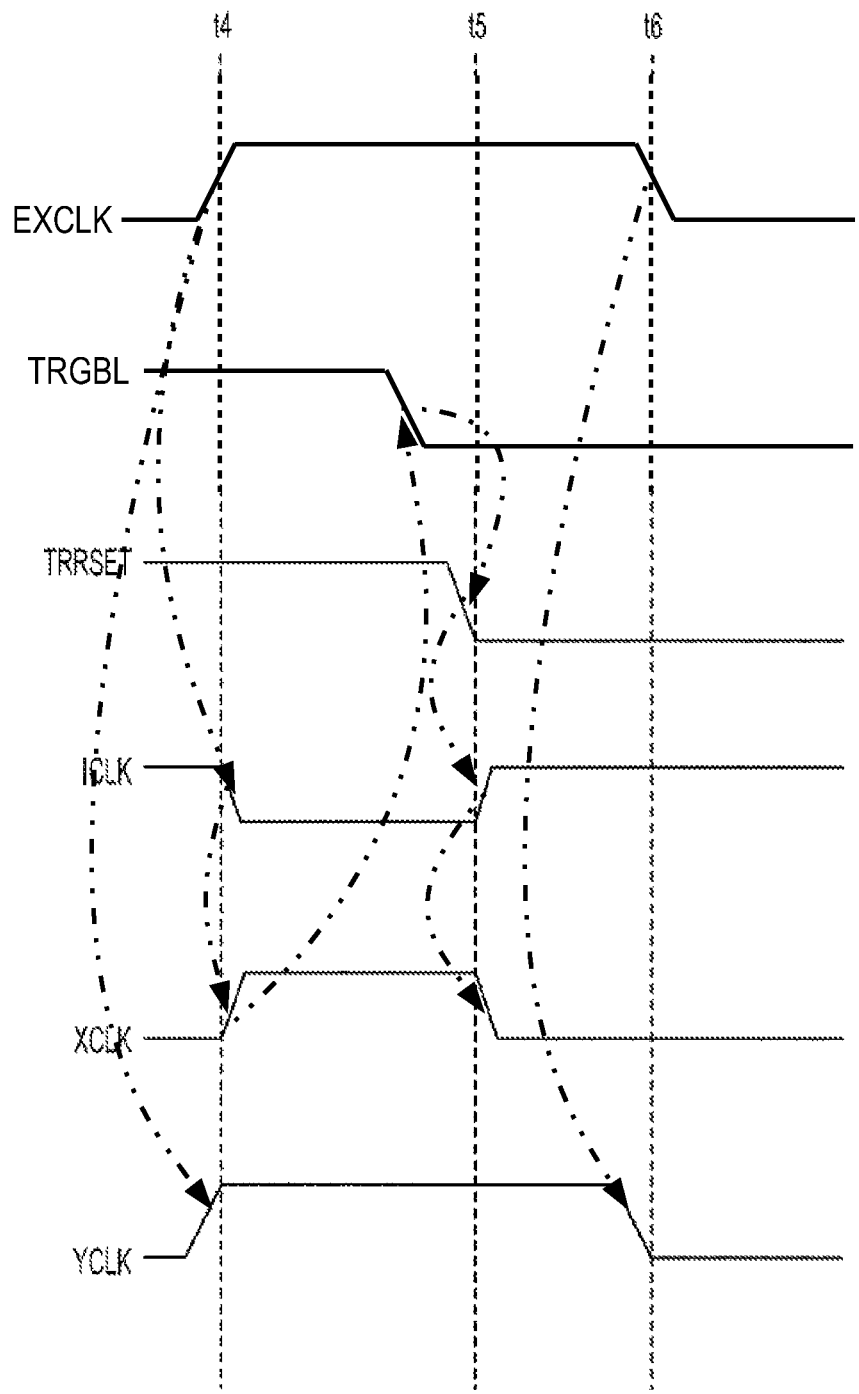

FIG. 10B is a graph of waveforms illustrating the relationship of various signals, in accordance with some embodiments. Times t4, t5, and t6 correspond to line 1005, 1015, and 1020 of FIG. 10A, respectively. Furthermore, delay circuit 820 (DLY 820 in FIG. 8) generates tracking reset signal TRRSET based on tracking global bit line TRGBL. Circuit DLY 820 additionally generates a time delay to control the timing of the transition of tracking global bit line TRGBL to generate tracking reset signal TRRSET.

At time t4, the rising edge of clock EXCLK causes clock ICLK to fall, clock XCLK to rise, and clock YCLK rise. As a result, clock EXCLK is logically high, signal TRGBL and TRRSET are logically high, clock ICLK is logically low, clock XCLK is logically high, and clock YCLK is logically high. Also, prior to time t5, tracking global bit line TRGBL transitions from a high logic value to a low logic value in a manner that has been similarly illustrated in conjunction with FIGS. 4, 5, and 9B.

As a result, prior to time t5, tracking global bit line TRGBL is pulled to reference voltage VSS or a low logic value at the source of transistor 128. At time t5, signal TRRSET falls, which causes clock ICLK to rise, clock XLCK to fall, but does not affect clock YCLK. As a result, clock YCLK remains logically high.

At time t5, signal TRRSET falls, which causes clock ICLK to rise, clock XLCK to fall, but does not affect clock YCLK. As a result, clock YCLK remains logically high.

At time t6, clock EXCLK falls and causes clock YCLK to fall.

Based on the above illustration with reference to FIGS. 9A, 9B, 10A, and 10B, the high duration of clock YCLK is achieved by performing a logical OR operation of the duration of clock EXCLK and clock ICLKI, which is the inverse of clock ICLK. As a result, the high duration of clock YCLK is the longer of the high duration of clock EXCLK and the low duration of clock ICLK or the high duration of clock ICLKI.

Various embodiments are advantageous because the high duration of clock YCLK is longer and provides a better read margin. For example, if clock ICLKI is used to perform the functions of clock YCLK, the high duration of clock ICLKI could be shorter than the high duration of clock YCLK, and therefore provides a smaller read margin. Based on a larger read margin, the read operation of memory macro 100 can be performed at a lower operational voltage.

Exemplary Method

Figure 11:
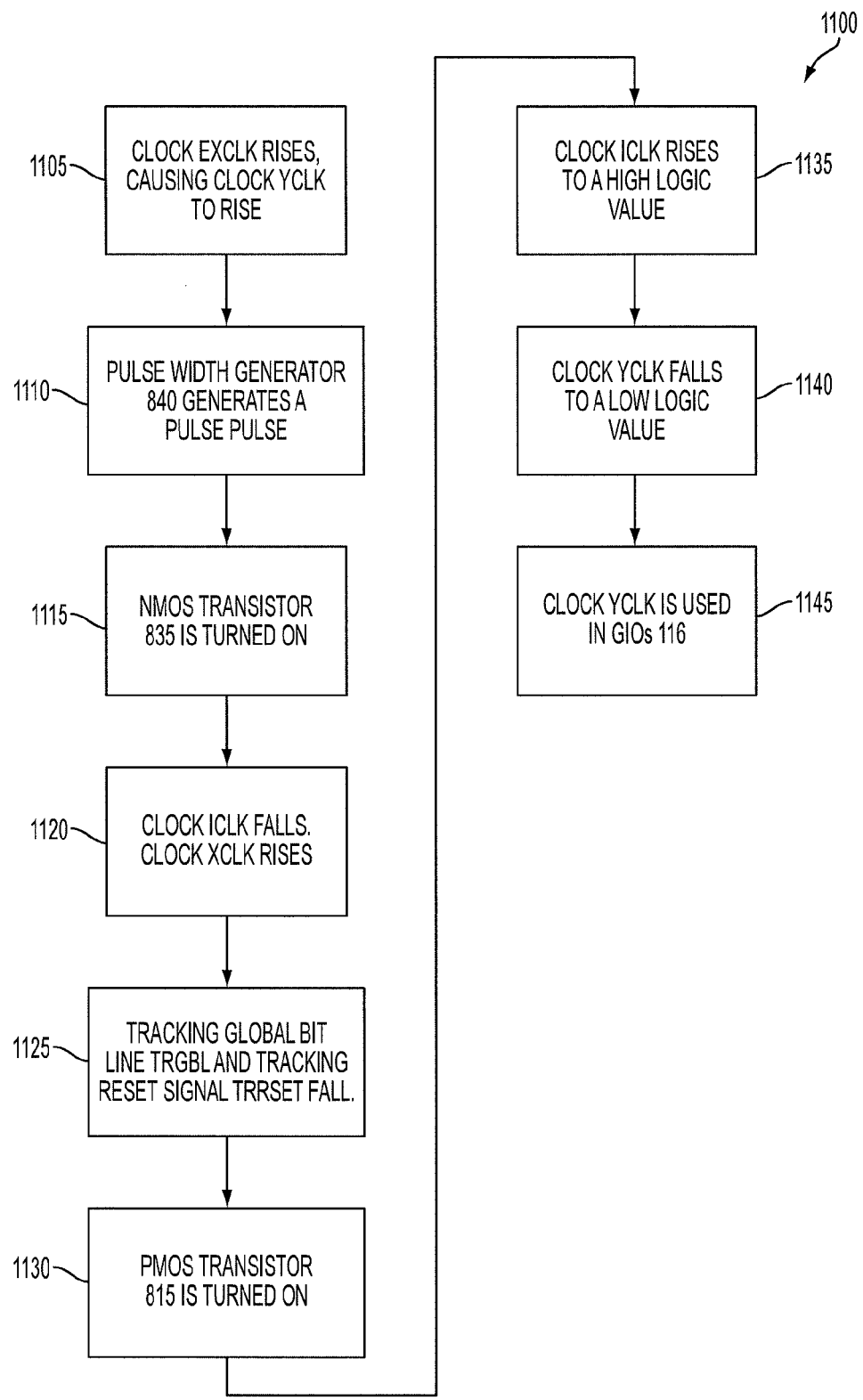
FIG. 11 is a flow chart illustrating an operation of the clock generation circuit, in accordance with some embodiments.

FIG. 11 is a flow chart of a method 1100 illustrating the creation of clock YCLK, in accordance with some embodiments. For illustration, initially, clock ICLK, tracking global bit line TRGBL, and tracking reset signal TRRSET are at a high logic value. In contrast, clock YCLK is at a low logic value.

In step 1105, clock EXCLK rises from a low logic value to a high logic value. The high logic value of clock EXCLK causes clock YCLK to rise.

In response, pulse width generator 840 generates a pulse PULSE having a positive pulse width in step 1110.

In step 1115, the high duration of pulse PULSE causes NMOS transistor 835 to turn on.

As a result, in step 1120, clock ICLK falls to a low logic value, which causes clock XCLK to rise to a high logic value.

In step, 1125, the high logic value of clock XCLK causes a tracking read word line RWL_TK of an upper tracking memory cell 124 and of a lower tracking memory cell 124 to be logically high. As a result, the upper tracking read bit line UP_TRRBL and the lower tracking read bit line LO_TRRBL corresponding to the upper tracking memory cell 124 and the lower tracking memory 124 are logically low. An LIO 106 coupled to the upper tracking read bit line UP_TRRBL and the lower tracking read bit line LO_TRRBL causes tracking global bit line TRGBL to be logically low. The falling of tracking global bit line TRGBL causes reset tracking signal TRRSET to fall to a logic low value.

As a result, in step 1130, PMOS transistor 815 is turned on. In various embodiments, delay circuit 820 is used to cause PMOS transistor 815 to turn on at a predetermined time. In addition, when PMOS transistor 815 is turned on, NMOS transistor 835 has been turned off to be electrically disconnected from clock ICLK. For example, the pulse PULSE generated in step 1110 is designed to fall before tracking reset signal TRRSET falls. Consequently, as soon as pulse PULSE falls, NMOS transistor 835 is turned off.

In step 1135, PMOS transistor 815 being on pulls clock ICLK to a high logic value at the source of transistor 815.

In step 1140, the rising transition of clock ICLK causes clock YCLK to fall from a high to a low logic value.

In step 1145, clock YCLK is used in the reading and writing of the data that have been transferred to global GIOs 116 of memory macro 100.

A number of embodiments have been described. It will nevertheless be understood that various modifications may be made without departing from the spirit and scope of the disclosure. For example, the various transistors being shown as a particular dopant type (e.g., N-type or P-type Metal Oxide Semiconductor (NMOS or PMOS)) are for illustration purposes. Embodiments of the disclosure are not limited to a particular type. Selecting different dopant types for a particular transistor is within the scope of various embodiments. The low or high logic level (e.g., Low or High) of the various signals used in the above description is also for illustration purposes. Various embodiments are not limited to a particular level when a signal is activated and/or deactivated. Selecting different levels is within the scope of various embodiments. The explanation in this document is in the context of an SRAM. The inventive concept, however, is applicable to other types of memories, including, for example, dynamic random access memories (DRAM), read only memories (ROM), programmable read only memories (PROM), erasable programmable read only memories (EPROMS), flash memories, etc.

Some embodiments regard a method. In the method, a first clock is received by a memory macro. In response to a first clock transition of the first clock, a first transition of a second clock and of a third clock is generated. A tracking transition of a tracking signal is caused by the second clock. Based on a later transition of a second clock transition of the first clock and the tracking transition of the tracking signal, a second transition of the third clock is generated. The third clock is for use by an input-output of the memory macro.

In some embodiments, a circuit comprises a first circuit, a second circuit and a third circuit. The first circuit is configured to cause a first transition of a first clock, a first transition of a second clock, and a first transition of a third clock, based on a first transition of a fourth clock. The second clock is configured to cause a transition of a tracking signal. The second circuit is configured to generate a second transition of the first clock based on the transition of the tracking signal. The third circuit is configured to generate a second transition of the third clock based on a second transition of the fourth clock or the transition of the tracking signal through a second transition of the first clock. The second clock and the third clock are configured to be used in a memory macro.

In some embodiments, a first clock is utilized to generate a second clock. The second clock is utilized to generate a tracking signal. The first clock and the tracking signal are utilized to generate a third clock. A width of the third clock is based on a larger of a width of the first clock and a time delay of the tracking signal with reference to an edge of the first clock. The second clock and the third clock are used in a memory macro.

The above methods show exemplary steps, but they are not necessarily performed in the order shown. Steps may be added, replaced, changed order, and/or eliminated as appropriate, in accordance with the spirit and scope of disclosed embodiments.

What is claimed is:

1. A method comprising:
responsive to a first clock transition of a first clock, causing a first transition of a second clock and of a third clock; and
based on a later transition of a second clock transition of the first clock and a tracking transition of a tracking signal, causing a second transition of the third clock,
wherein
the first clock is received by a memory macro;
the tracking transition of the tracking signal is caused by a tracking circuit driven by the first transition of the second clock; and
the third clock is for use by an input-output of the memory macro.

2. The method of claim 1, wherein
the second clock and the third clock are generated based on a fourth clock generated by the first clock.

3. The method of claim 1, wherein
the tracking circuit includes a tracking read bit line coupled to a tracking memory cell and a tracking input/output (IO) circuitry; and
a logic value of the second clock, through the tracking memory cell, changes a read bit line state of the tracking read bit line and an IO state of the tracking IO circuitry.

4. The method of claim 1 wherein
the first transition of the second clock is further caused by a first transition of a fourth clock;
the first transistor of the fourth clock is caused based on a pulse width turning on an N-type metal oxide semiconductor (NMOS) transistor; and
the pulse width is generated responsive to the first clock transition of the first clock.

5. The method of claim 4, wherein the pulse width is disabled before the tracking transition of the tracking signal.

6. The method of claim 1, wherein the tracking transition of the tracking signal turns on a P-type metal oxide semiconductor (PMOS) transistor that pulls up a transition of a fourth clock that in turn causes the second transition of the third clock.

7. The method of claim 6, wherein the tracking transition of the tracking signal is further based on a time delay.

8. A circuit comprising:
a tracking circuit;
a first circuit configured to cause a first transition of a first clock, a first transition of a second clock, and a first transition of a third clock, based on a first transition of a fourth clock;
a second circuit configured to generate a second transition of the first clock based on a transition of a tracking signal; and
a third circuit configured to generate a second transition of the third clock based on a second transition of the fourth clock or the transition of the tracking signal through the second transition of the first clock,
wherein
the tracking circuit is configured to cause the transition of the tracking signal responsive to the first transition of the second clock; and
the second clock and the third clock are configured to be used in a memory macro.

9. The circuit of claim 8, wherein
the first circuit includes an N-type metal oxide semiconductor (NMOS) transistor and a pulse width generator configured to generate a pulse at the gate of the NMOS transistor; and
the second circuit includes a P-type metal oxide semiconductor (PMOS) transistor having a gate configured to receive the tracking signal, and a source configured to receive the first clock.

10. The circuit of claim 9, further comprising a delay circuit connected to the gate of the PMOS transistor and configured to receive the tracking signal.

11. The circuit of claim 9, wherein the pulse width generator is configured to generate the pulse width to turn off the NMOS transistor before the transition of the tracking signal.

12. The circuit of claim 8, further comprising
a latch configured to store a logic state of the first clock; and
a fourth circuit configured to receive the first clock and generate the second clock.

13. A method comprising:
utilizing a first transition of a first clock to cause a first transition of a second clock and a first transition of the third clock;
utilizing, by a tracking circuit, the first transition of the second clock to cause a first transition of a fourth clock;
utilizing, by the tracking circuit, a logic level of the fourth clock to cause a transition of a tracking signal;
utilizing the transition of the tracking signal to cause a second transition of the second clock; and
utilizing a second transition of the first clock or the second transition of the second clock to cause a second transition of the third clock,
wherein
the third clock and the fourth clock are used in a memory macro.

14. The method of claim 13, wherein
the first transition of the second clock is further caused by turning on an N-type metal oxide semiconductor (NMOS) transistor; and
the second transition of the second clock is further based on the tracking signal turning on a P-type metal oxide semiconductor (PMOS) transistor.

15. The method of claim 14, wherein the NMOS transistor is turned off before the PMOS transistor is turned on.

16. The method of claim 14, wherein
the NMOS transistor is turned on based on a pulse width generated in response to the first transition of the first clock.

17. The method of claim 13, wherein
the tracking circuit includes a tracking read bit line coupled to a tracking memory cell and a tracking input/output (IO) circuitry; and
the logic value of the fourth clock, through the tracking memory cell, changes a read bit line state of the tracking read bit line and an TO state of the tracking TO circuitry.

18. The method of claim 13, wherein
the first transition of the first clock rises, the second transition of the first clock falls;
the first transition of the second clock falls, the second transition of the second clock rises;
the first transition of the third clock rises, the second transition of the third clock falls; and
the first transition of the fourth clock rises, the second transition of the fourth clock falls.

19. The method of claim 13, wherein the second transition of the second clock is further caused by a time delay.

20. The method of claim 13, wherein
the second transition of the first clock is used to cause the second transition of the third clock if the second transition of the first clock changes after the transition of the tracking signal; and
the second transition of the second clock is used to cause the second transition of the third clock if the second transition of the first clock changes before the transition of the tracking signal.

* * * * *